(12) United States Patent
Liao et al.

(10) Patent No.: US 9,110,447 B2
(45) Date of Patent: Aug. 18, 2015

(54) WATCH HAVING MICROPHONE

(71) Applicant: HON HAI PRECISION INDUSTRY CO., LTD., New Taipei (TW)

(72) Inventors: Kuang-Yao Liao, New Taipei (TW); Shiang-Hua Lin, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 218 days.

(21) Appl. No.: 13/869,898

(22) Filed: Apr. 24, 2013

(65) Prior Publication Data

US 2014/0177877 A1    Jun. 26, 2014

(30) Foreign Application Priority Data

Dec. 21, 2012   (TW) .............................. 101148903 A

(51) Int. Cl.
| | | |
|---|---|---|
| H04R 3/00 | (2006.01) | |
| G04G 21/06 | (2010.01) | |
| H03F 3/68 | (2006.01) | |

(52) U.S. Cl.
CPC ................ *G04G 21/06* (2013.01); *H03F 3/68* (2013.01); *H04R 3/00* (2013.01)

(58) Field of Classification Search
CPC .................................................. G04G 21/06
USPC ........... 381/122, 111, 120; 368/10, 281, 276; 455/563; 307/104; 320/108
See application file for complete search history.

(56) References Cited

U.S. PATENT DOCUMENTS

| | | | |
|---|---|---|---|
| 6,606,506 B1* | 8/2003 | Jones ........................ | 455/556.1 |
| 2005/0265125 A1* | 12/2005 | Yoshida et al. ................ | 368/10 |
| 2009/0069045 A1* | 3/2009 | Cheng ........................ | 455/556.1 |
| 2010/0111333 A1* | 5/2010 | Dinnissen et al. ............ | 381/122 |
| 2012/0299389 A1* | 11/2012 | Lee et al. ...................... | 307/104 |

* cited by examiner

*Primary Examiner* — Vivian Chin
*Assistant Examiner* — Friedrich W Fahnert
(74) *Attorney, Agent, or Firm* — Novak Druce Connolly Bove + Quigg LLP

(57) ABSTRACT

A watch includes a main body and a sound input body. The sound input body includes a microphone, a signal transmitting coil unit, a power receiving coil unit, and a power receiving unit. The main body includes an interface unit, a signal receiving coil unit coupling the signal transmitting coil unit, a signal amplification unit, a power transmitting unit, a power transmitting coil unit, and a control unit. The microphone converts a voice signal input to an electric signal, which is transmitted to the control unit by the signal transmitting coils coupling with the signal receiving coils. The control unit executes corresponding function in response to the electric signal. The electric signal obtained by the control unit is transmitted to the power receiving unit by the power transmitting coils coupling with the power receiving coils to power the microphone.

5 Claims, 2 Drawing Sheets

WATCH HAVING MICROPHONE

CROSS-REFERENCES TO RELATED APPLICATIONS

Related subject matter is disclosed in co-pending U.S. patent application Ser. No. 13,869,894 and a title of WATCH CAPABLE OF PLAYING SOUND, and an U.S. patent application Ser. No. 13,869,030 and a title of WATCH HAVING MICROPHONE, which have the same assignees as the current application and were concurrently filed.

BACKGROUND

1. Technical Field

The present disclosure relates to watches and, particularly, to a watch having a microphone.

2. Description of the Related Art

Smart watches are employed for events reminding and time reminding besides displaying time and data. Some smart watches entitles users to input events via microphone employed by the smart watch. The microphone is mounted in the watch which results in a additional circuit board being mounted in the watch and thicken the watch. Furthermore, the additional circuit board is powered by a battery of the watch which results in shortening service life of the battery of the watch.

Therefore, there is room for improvement within the art.

BRIEF DESCRIPTION OF THE DRAWINGS

The components in the drawings are not necessarily drawn to scale, the emphasis instead being placed upon clearly illustrating the principles of a lamp tube switch circuit. Moreover, in the drawings, like reference numerals designate corresponding parts throughout the several views.

DETAILED DESCRIPTION

Figure 1:
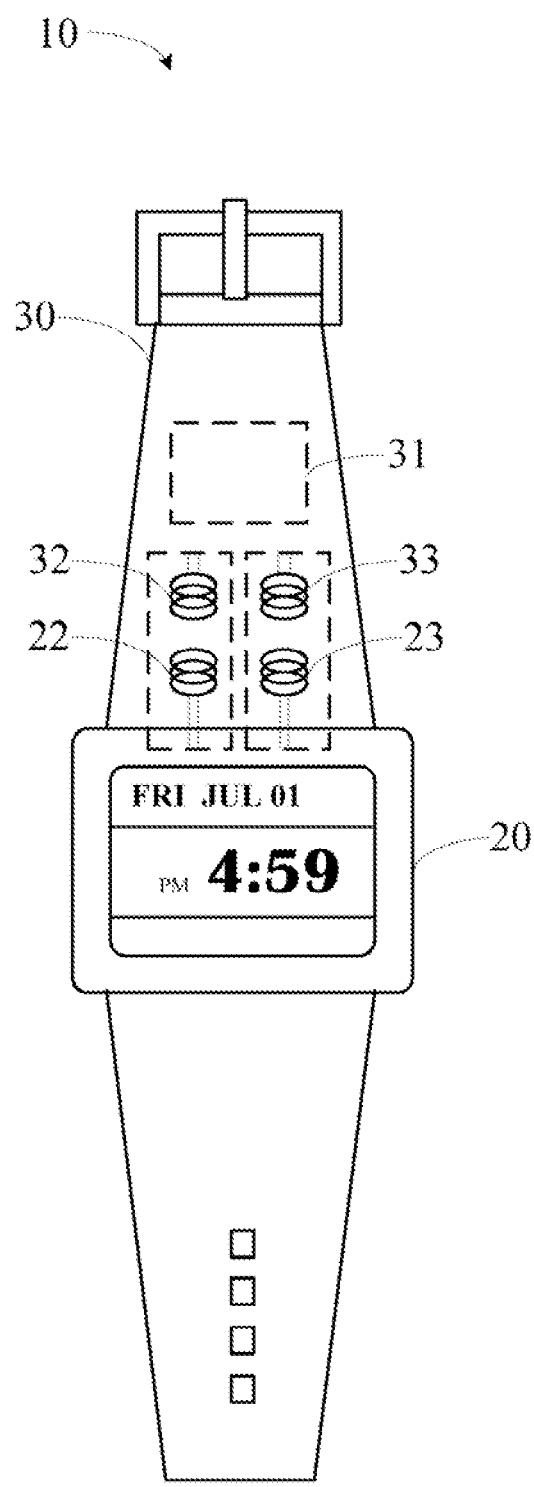
FIG. 1 is a schematic view of a watch having a microphone in accordance with an exemplary embodiment.

Referring to FIG. 1, a watch 10 includes a main body 20 and a sound input body 30. In the embodiment, the watch 10 further includes a strap configured to tie the main body 20 to user's wrist, and the sound input body 30 is mounted on the strap. In an alternative embodiment, the sound input body 30 is mounted on the main body 20. The main body 20 includes a display screen for displaying time and data.

Figure 2:
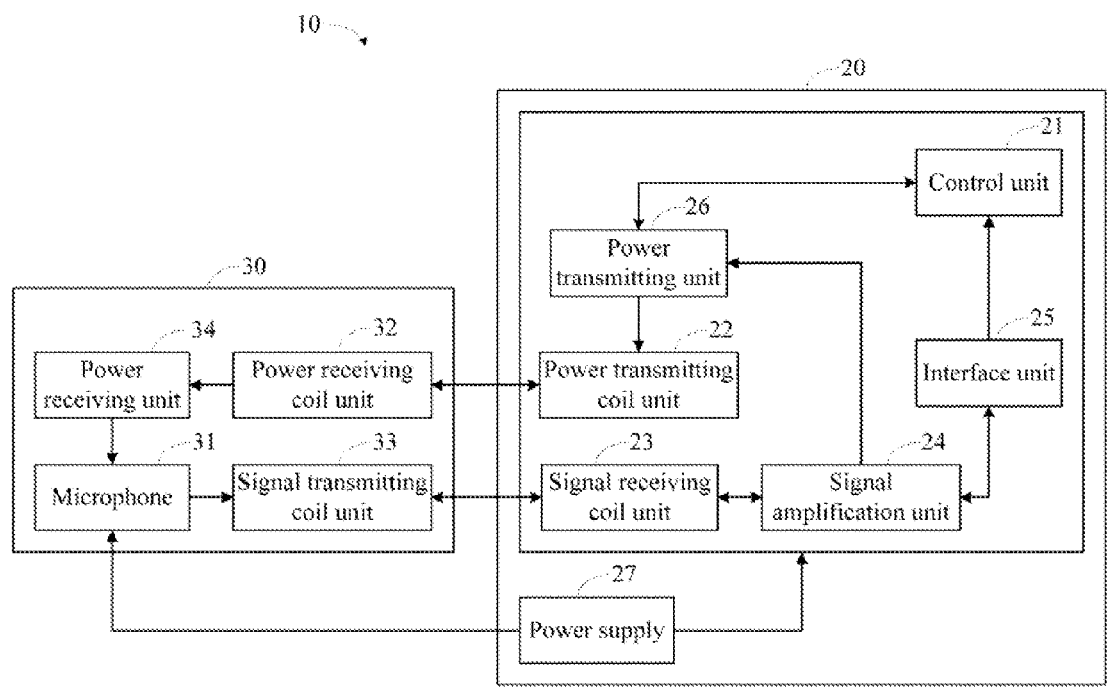
FIG. 2 is a diagram of the watch of FIG. 1 in accordance with an exemplary embodiment.

Referring to FIG. 2, the main body 20 includes a control unit 21, a power transmitting coil unit 22, a signal receiving coil unit 23, and a signal amplification unit 24, an interface unit 25, a power transmitting unit 26, and a power supply 27. The sound input body 30 includes a microphone 31, a power receiving coil unit 32, a signal transmitting coil unit 33, and a power receiving unit 34. The signal transmitting coil unit 33 is connected to the microphone 31. The power transmitting coil unit 22 and the signal receiving coil unit 23 are mounted on the main body 20, where the power transmitting coil unit 22 coupling the power receiving coil unit 32 and the signal receiving coil unit 23 coupling the signal transmitting coil unit 33. In the embodiment, the power transmitting coil unit 22 and the signal receiving coil unit 23 are mounted on a frame of the main body 20.

The power supply 27 powers the main body 20 when there is no sound signal input. The power supply 27 provides an initial working voltage for enabling the microphone 31 to receive sound signal input by a user. The sound signal input is converted into electric signal by the microphone 31. The signal transmitting coil unit 33 generates an inducted electromagnetic field in response to the electric signal transmitted by the microphone 31. In the embodiment, the microphone 31 is mounted on the surface of the strap.

The generation of the electromagnetic field results in the generation of electric signal in the signal receiving coil unit 23. The signal amplification unit 24 is connected between the signal receiving coil unit 23 and the interface unit 25, and configured to amplify the electric signal from the signal receiving coil unit 23. The control unit 21 recognizes the electric signal amplified by the signal amplification unit 24 via the interface unit 25 to execute a corresponding function.

The power transmitting unit 26 is connected between the signal amplification unit 24 and the control unit 21, and configured to convert the electric signal into a voltage signal with a predetermined value.

The power transmitting coil unit 22 generates an inducted electromagnetic filed in response to the voltage signal converted by the signal amplification unit 24. The generation of the electromagnetic field results in the generation of electric signal in the power receiving coil unit 32. The power receiving unit 34 is connected to the microphone 31, and converts the electric signal from the power receiving coil unit 32 into a voltage signal with a predetermined value for powering the microphone 31. Thereby, the microphone 31 can receive sound signal input by a user powered by the power receiving unit 34.

It is understood that the present disclosure may be embodied in other forms without departing from the spirit thereof. Thus, the present examples and embodiments are to be considered in all respects as illustrative and not restrictive, and the disclosure is not to be limited to the details given herein.

What is claimed is:

1. A watch comprising a main body and a sound input body, wherein the main body includes a power supply, and the sound input body comprises:
  a microphone powered by the power supply and configured to detect and receive sound and convert the sound into an electric signal;
  a signal transmitting coil unit connected to the microphone, configured to generate an induced electromagnetic field in response to the generation of the electric signal;
  a power receiving coil unit configured to generate an electric signal in response to the generation of the electromagnetic field around the power transmitting coil unit; and
  a power receiving unit configured to convert the electric signal generated by the power receiving coil unit into a voltage signal for powering the microphone;
  the main body comprising:
    an interface unit;
    a signal receiving coil unit coupled with the signal transmitting coil unit, and configured to generate an electric signal in response to the generation of the induced electromagnetic field around the signal transmitting coil unit;
    a signal amplification unit configured to amplify the electric signal generated by the signal receiving coil unit;
    a power transmitting unit configured to convert the electric signal amplified by the signal amplification unit into a voltage signal with a predetermined value;

a power transmitting coil unit configured to generate an induced electromagnetic field in response to the voltage signal converted by the power transmitting unit; and a control unit connected to the signal amplification unit via the interface unit, configure to recognize the electric signal amplified by the signal amplification unit to execute corresponding function.

2. The watch as recited in claim 1, further comprising a strap configured to tie the main body to user's wrist, and the sound input body is mounted on the strap.

3. The watch as recited in claim 2, wherein the sound input body is mounted on the main body.

4. The watch as recited in claim 1, wherein the power transmitting coil unit and the signal receiving coil unit are mounted on a frame of the main body.

5. The watch as recited in claim 1, wherein the microphone is configured to detect and recognize voice sound and convert the voice sound into the electric signal.

* * * * *